(12) United States Patent
Nguyen et al.

(10) Patent No.: US 7,256,626 B2
(45) Date of Patent: Aug. 14, 2007

(54) LOW-VOLTAGE DIFFERENTIAL SIGNAL DRIVER WITH PRE-EMPHASIS CIRCUIT

(75) Inventors: Hai Thanh Nguyen, Sunnyvale, CA (US); Chung-Cheng Tsai, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/164,405

(22) Filed: Nov. 22, 2005

(65) Prior Publication Data
US 2007/0115034 A1 May 24, 2007

(51) Int. Cl.
*H03K 3/00* (2006.01)

(52) U.S. Cl. .................. 327/112; 326/83; 330/149; 375/296

(58) Field of Classification Search .............. 327/108, 327/109, 112; 326/82, 83
See application file for complete search history.

(56) References Cited

U.S. PATENT DOCUMENTS

| | | | | |
|---|---|---|---|---|
| 6,054,874 A | * | 4/2000 | Sculley et al. ............... | 326/83 |
| 6,111,431 A | * | 8/2000 | Estrada ........................ | 326/83 |
| 6,281,715 B1 | * | 8/2001 | DeClue et al. ................ | 327/65 |
| 6,294,924 B1 | * | 9/2001 | Ang et al. ..................... | 326/30 |
| 6,483,349 B2 | * | 11/2002 | Sakata et al. ................. | 326/83 |
| 6,646,482 B2 | * | 11/2003 | Takeuchi ..................... | 327/112 |
| 6,784,690 B2 | * | 8/2004 | Tran et al. .................... | 326/30 |
| 7,183,813 B2 | * | 2/2007 | Kasanyal et al. ............. | 327/65 |

* cited by examiner

*Primary Examiner*—Tuan T. Lam
*Assistant Examiner*—William Hernandez
(74) *Attorney, Agent, or Firm*—Jianq Chyun IP Office

(57) ABSTRACT

A low-voltage differential signal driver with a pre-emphasis circuit having a current control circuit and a pre-emphasis circuit is provided. Wherein, the pre-emphasis circuit includes the current sourcing circuit and the current sinking circuit, both of which have similar circuit structure, coupled to the current control circuit, respectively. The current sourcing circuit and the current sinking circuit are controlled by two sets of driving signals, so that the pre-emphasis circuit provides an extra driving current to the current control circuit at an instant when the current control circuit switches the current direction. In addition, each set of driving signals contains two synchronous but phase-inversed driving signals. The time it takes for the current steering circuit to switch terminated resistor current between upward and downward directions is decreased.

20 Claims, 4 Drawing Sheets

LOW-VOLTAGE DIFFERENTIAL SIGNAL DRIVER WITH PRE-EMPHASIS CIRCUIT

BACKGROUND OF THE INVENTION

1. Field of Invention

The present invention relates to a low voltage differential signal driver and a pre-emphasis circuit, and more particularly, to a low voltage differential signal driver with high switching speed and high resolution and a pre-emphasis circuit thereof.

2. Description of the Related Art

The low voltage differential signal (LVDS) technology is applied in data transmission systems. The LVDS generated by a line driver has a typical value of peak-to-peak voltage, ranging from 250 mV to 450 mV. In cases of high transmission rate, a low-voltage switch is helpful in reducing the power consumption. Therefore, LVDS technology is especially suitable for high-speed data transmission, such as video data processing. In fact, LVDS applications can be found, more or less, in professional video processing devices and electronic consumer products, such as flat panel display and notebook computers.

FIG. 1 is a schematic circuit drawing of a conventional low-voltage differential signal driver. Referring to FIG. 1, the conventional LVDS driver comprises the transistor M11, M12, M13 and M14. Wherein, the first source/drain end of the transistor M11 is connected to a voltage supply VDD via a driving current source I1 and the first source/drain end of the transistor M13. The gate end of the transistor M11 receives a driving signal VIN1. The second source/drain end of the transistor M11 is connected to the first source/drain end of the transistor M12 and one end of a load resistor Rt. Similarly, the gate end and the second source/drain end of the transistor M13 are connected to a driving signal VIN2 and the first source/drain end of the transistor M14, respectively, and the second source/drain end of the transistor M13 is also connected to another end of the load resistor Rt. In addition, the gate end and the second source/drain end of the transistor M12 are connected to the driving signal VIN2 and the ground via a resistor R1, respectively. The gate end and the second source/drain end of the transistor M14 are connected to the driving signal VIN1 and the second source/drain end of the transistor M12, respectively.

When the driving signal VIN1 is enabled, it would turn on the transistor M11 and M14. Meanwhile, the driving current generated by the driving current source I1 flows into the first source/drain end of the transistor M11, passes the node 103, and gets to the load resistor Rt in the direction indicated by arrow A. Then the driving current passes the node 105, then reaches the ground via the transistor M14 and the resistor R1. Whereas, when the driving signal VIN2 is enabled, the transistor M13 and M12 will be turned on. Meanwhile, the driving current flows into the first source/drain end of the transistor M13, passes the node 105, and gets to the load resistor Rt in the direction indicated by arrow B. Then, the driving current passes the node 103, and then reaches the ground via the first source/drain end of the transistor M12, the second source/drain end of the transistor M12 and the resistor R1.

The disadvantage of the LVDS driver shown in FIG. 1 is that the switching speed of the current passing through the load resistor Rt is limited by the size of the driving current source I1. That is, the switching speed between route A and B of the current passing through the load resistor Rt, is limited by the size of the driving current source I1, such that the switching speed of the LVDS driver becomes slower. The details can be referred to the U.S. Pat. No. 6,281,715.

To solve the above-described problem, the U.S. Pat. No. 6,281,715 also provides an LVDS driver. Referring to FIG. 2 in the U.S. Pat. No. 6,281,715, the disclosed LVDS driver generates an additional current ID2 to a current control circuit 201 by means of a current mirror circuit 207 at the instant of switching the current when flowing through the load resistor RL. Thus, the current control circuit 201 can utilize both the current ID1 and ID2 to increase the switching speed.

In the LVDS driver disclosed in the U.S. Pat. No. 6,281,715, five inverters ID1~ID5 and an exclusive-NOR gate XNOR are used to receive an input signal IN and to control the turn-on sequence of the transistor M21, M22, M23 and M24. Therefore, these logic gates would take a lot of processing time. In particular, the delay when the signals travel through the exclusive-NOR gate consumes the most part of time.

In addition, due to the asynchrony between the control signal to turn on the transistor M25 and M27 and the control signal to turn on the transistor M26 and M28, the timing of turning on the transistor M25 and M26 is somewhat different from that of turning on the transistor M27 and M28. Consequently, the resolution performance of the LVDS driver disclosed in the U.S. Pat. No. 6,281,715 declines.

SUMMARY OF THE INVENTION

It is an object of the present invention to provide a pre-emphasis circuit, suitable for an LVDS driver. The pre-emphasis circuit of the present invention can precisely provide an additional current to the LVDS driver at the instant when the LVDS driver switches the current direction.

Another object of the present invention is to provide an LVDS driver with high switching speed, suitable for operation in a high data transmission rate.

The present invention provides a pre-emphasis circuit, suitable for an LVDS driver with a current input end and a current output end. The pre-emphasis circuit of the present invention comprises a first PMOS (P-type metal oxide semiconductor) transistor, a second PMOS transistor, a third PMOS transistor and a fourth PMOS transistor. Wherein, the first source/drain end and the second source/drain end of the first PMOS transistor are coupled to the first source/drain end of the third PMOS transistor and the first source/drain end of the second PMOS transistor, respectively. The first PMOS transistor is connected to a voltage supply via a first resistor, and the gate end receives a first driving signal with a preset time delay. Similarly, the second source/drain end of the third PMOS transistor is coupled to the first source/drain end of the fourth PMOS transistor, and the gate end of the third PMOS transistor receives a second driving signal with a preset time delay. While the original first driving signal and the original second driving signal are sent to the gate end of the second PMOS transistor and the gate end of the fourth PMOS transistor, respectively. The second source/drain end of the second PMOS transistor and the second source/drain end of the fourth PMOS transistor are commonly coupled to the current input end of the LVDS driver. In addition, the pre-emphasis circuit of the present invention also comprises a first NMOS (N-type metal oxide semiconductor) transistor, a second NMOS transistor, a third NMOS transistor and a fourth NMOS transistor. Wherein, the first source/drain end and the second source/drain end of the first NMOS transistor are coupled to the first source/drain end of the third NMOS transistor and the first source/drain end of the second NMOS transistor, respectively. The first NMOS transistor is also coupled to the current output end of the LVDS driver. The gate end of the first NMOS transistor receives a third driving signal. Similarly, the gate end and the second source/drain end of the third NMOS transistor are coupled to the fourth driving signal and the first source/drain end of the fourth NMOS transistor, respectively. The third driving signal with a preset time delay and the fourth driving signal with a preset time delay are sent to the gate end of the second NMOS transistor and the gate end of the fourth NMOS transistor, respectively. And the second source/drain end of the second NMOS transistor and the second source/drain end of the fourth NMOS transistor are commonly connected to the ground via a second resistor.

In one embodiment, the pre-emphasis circuit of the present invention also comprises a first buffer module and a second buffer module. Wherein, the first buffer module comprises a first inverter, a second inverter, a third inverter and a fourth inverter. The input ends of the first inverter and the second inverter receive the second driving signal and the first driving signal, respectively. The output ends of the first inverter and the second inverter are coupled to the input ends of the third inverter and the fourth inverter, so that the third inverter can generate the second driving signal with a preset time delay to the gate of the third PMOS transistor and the fourth inverter can generate the first driving signal with a preset time delay to the gate of the first PMOS transistor, respectively. Similarly, the second buffer module comprises a fifth inverter, a sixth inverter, a seventh inverter and an eighth inverter. Wherein, the input ends of the fifth inverter and the sixth inverter receive the fourth driving signal and the third driving signal, respectively. The output ends of the fifth inverter and the sixth inverter are coupled to the input ends of the seventh inverter and the eighth inverter, so that the seventh inverter can generate the fourth driving signal with a preset time delay to the gate of the second NMOS transistor and the eighth inverter can generate the third driving signal with a preset time delay to the gate of the fourth NMOS transistor, respectively.

Moreover, the present invention provides an LVDS driver with a pre-emphasis circuit. The LVDS driver comprises not only the above-mentioned pre-emphasis circuit, but also a current control circuit. Wherein, the current control circuit has a current input end and a current output end. The current input end is coupled to the second source/drain ends of the above-mentioned second PMOS transistor and the fourth PMOS transistor, and the current output end is coupled to the first source/drain ends of the above-mentioned first NMOS transistor and the third NMOS transistor. Besides, the current input end of the current control circuit is connected to the voltage supply via a first driving current source, and the current output end is grounded via a second driving current source. Further, the current control circuit comprises also a first output end and a second output end, both of which are coupled to a load.

In an alternative solution, the present invention provides an LVDS driver with a pre-emphasis circuit which has a similar structure as the above-described LVDS driver, but the current output end of the current control circuit is grounded via a resistor.

In an embodiment of the present invention, the above-mentioned current control circuit comprises a fifth PMOS transistor, a sixth PMOS transistor, a fifth NMOS transistor and a sixth NMOS transistor. Wherein, the first source/drain end and the second source/drain end of the fifth PMOS transistor are coupled to the above-mentioned current input end and the first output end, respectively, and the gate end receives the second driving signal. Similarly, the first source/drain end and the second source/drain end of the sixth PMOS transistor are coupled to the above-mentioned current input end and the second output end, respectively, and the gate end receives the first driving signal. Besides, the first source/drain end and the second source/drain end of the fifth NMOS transistor are coupled to the above-mentioned first output end and the current output end, respectively, and the gate end receives the fourth driving signal. Likewise, the first source/drain end and the second source/drain end of the sixth NMOS transistor are coupled to the above-mentioned second output end and the current output end, respectively, and the gate end receives the third driving signal.

In another perspective, the present invention provides a pre-emphasis circuit suitable for an LVDS driver with a current input end and a current output end. The pre-emphasis circuit comprises a first transistor, a second transistor, a third transistor and a fourth transistor. Wherein, the first source/drain end and the second source/drain end of the first transistor are coupled to the first source/drain ends of the second transistor and the third transistor, respectively, and are coupled to the voltage source through a first resistor. The gate end of the first transistor receives the first driving signal with a preset time delay. Similarly, the second source/drain end of the third transistor is coupled to the first source/drain ends of the fourth transistor, and the gate end of the third transistor receives the second driving signal with a preset time delay. The original first driving signal and the second driving signal are sent to the gate ends of the second transistor and the fourth transistor, respectively, and the second source/drain ends of the second transistor and the fourth transistor are jointly connected to the current input end of the LVDS driver. In addition, the pre-emphasis circuit of the present invention further comprises a fifth transistor, a sixth transistor, a seventh transistor and an eighth transistor. Wherein, the first source/drain end and the second source/drain end of the fifth transistor are coupled to the first source/drain ends of the sixth transistor and the seventh transistor, respectively, and are coupled to the current output end of the LVDS driver. The gate end of the fifth transistor receives the third driving signal. Similarly, the gate end and the second source/drain end of the seventh transistor are coupled to the fourth driving signal and the first source/drain ends of the eighth transistor. The third driving signal with a preset time delay and the fourth driving signal with a preset time delay are sent to the gate ends of the sixth transistor and the eighth transistor, respectively, and the second source/drain ends of the sixth transistor and the eighth transistor are jointly grounded via a second resistor.

In another perspective, the LVDS driver with a pre-emphasis circuit provided by the present invention comprises a pre-emphasis circuit comprising the first transistor, the second transistor, the third transistor, the fourth transistor, the fifth transistor, the sixth transistor, the seventh transistor and the eighth transistor. The LVDS driver further comprises a current control circuit, wherein the current control circuit has a current input end and a current output end. The current input end is connected to the second source/drain ends of the second transistor and the fourth transistor, and the current output end is connected to the first source/drain ends of the fifth transistor and the seventh transistor. Besides, the current control circuit further comprises a first output end and a second output end, both of which are connected to a load.

In an embodiment of the present invention, the current control circuit comprises a ninth transistor, a tenth transistor, a eleventh transistor and a twelfth transistor. Wherein, the first source/drain end and the second source/drain end of the ninth transistor are coupled to the current input end and the first output end, respectively, and the gate end receives the second driving signal. Similarly, the first source/drain end and the second source/drain end of the eleventh transistor are coupled to the above-mentioned current input end and the second output end, respectively, and the gate end receives the first driving signal. In addition, the first source/drain end and the second source/drain end of the tenth transistor are coupled to the above-mentioned first output end and the current output end, and the gate end receives the fourth driving signal. Likewise, the first source/drain end and the second source/drain end of the twelfth transistor are coupled to the second output end and the current output end, and the gate end receives the third driving signal. The current input end is coupled to the voltage supply via a first driving current source, while the current output end is grounded via a second driving current source or via a third resistor.

In the present invention, as the above-mentioned, all of the first transistor, the second transistor, the third transistor, the fourth transistor, the ninth transistor and the eleventh transistor have the same electric characteristics, which are opposite to that of the fifth transistor, the sixth transistor, the seventh transistor, the eighth transistor, the tenth transistor and the twelfth transistor.

To sum up, the present invention makes the first driving signal and the second driving signal synchronous but phase-inverted, and makes the third driving signal and the fourth driving signal synchronous but phase-inverted. Accordingly, the pre-emphasis circuit provided by the present invention would, at the instant when the LVDS switches the current direction, precisely generate an extra current to enhance the switching speed.

On the other hand, for each driving signal, only two inverters are required to process the signal. Consequently, the delay time required by the LVDS driver of the present invention can be reduced, leading to a higher switching speed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
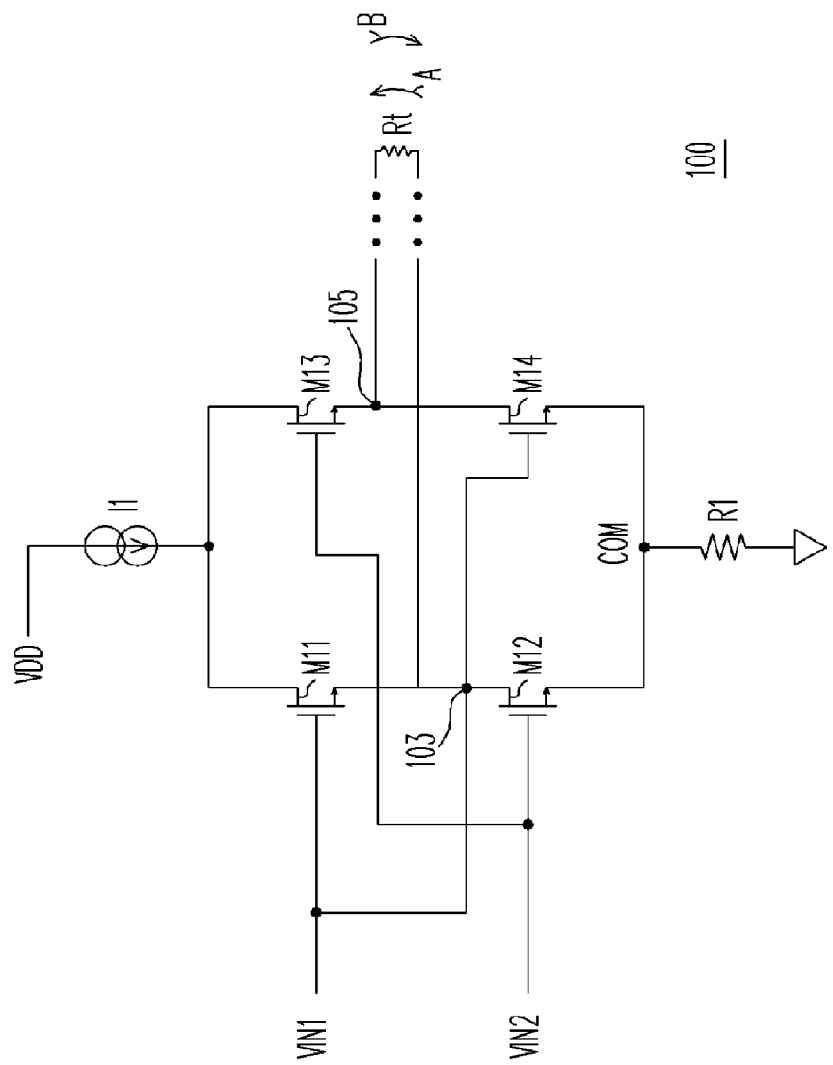
FIG. 1 is a schematic circuit drawing of a conventional low-voltage differential signal driver.
Figure 2:
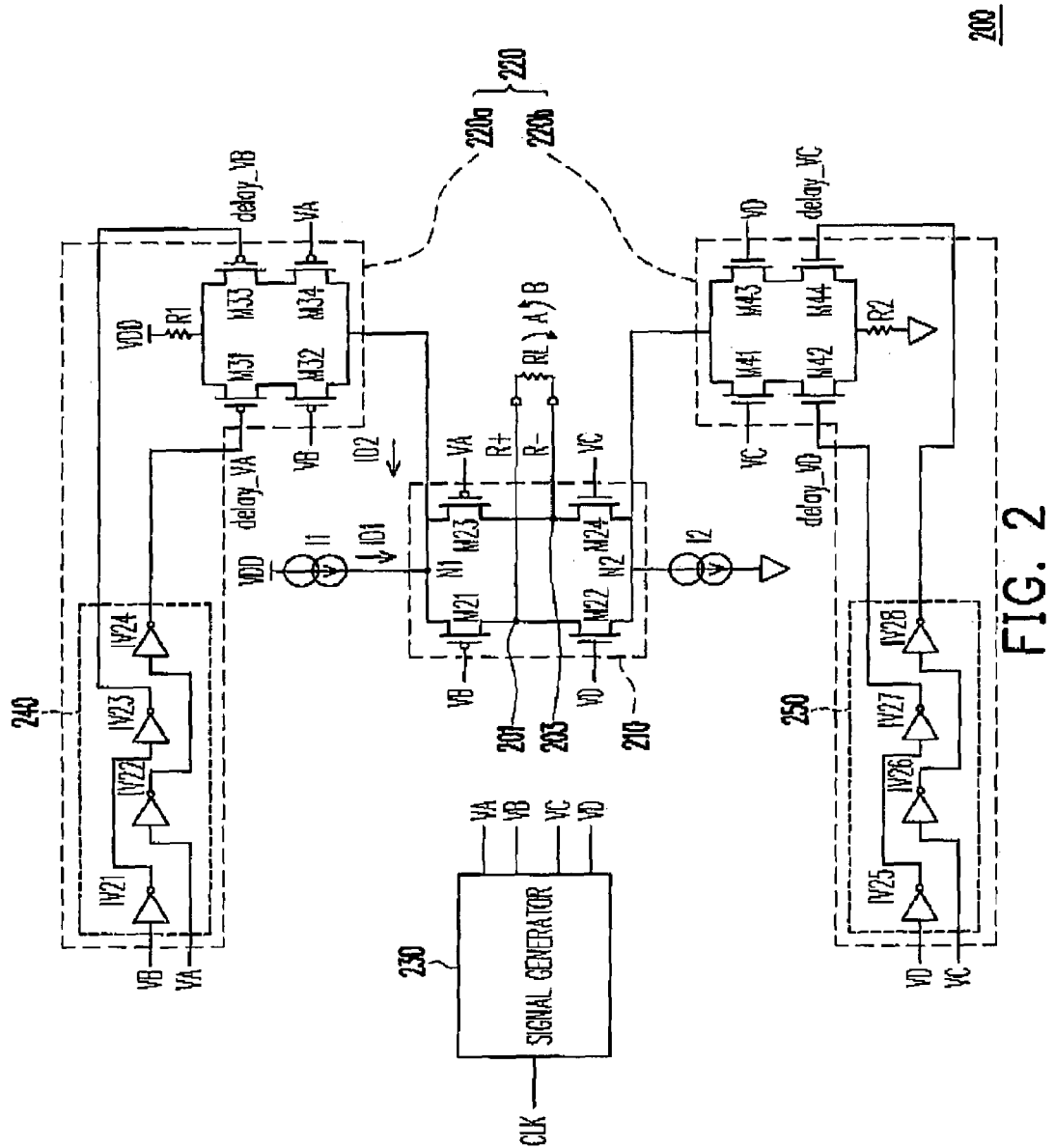
FIG. 2 is a schematic circuit drawing of a low-voltage differential signal driver with a pre-emphasis circuit in accordance with an embodiment of the present invention.

FIG. 2 is a schematic circuit drawing of a low-voltage differential signal driver with a pre-emphasis circuit in accordance with an embodiment of the present invention. Referring to FIG. 2, the LVDS driver 200 comprises a current control circuit 210 and a pre-emphasis circuit 220.

Wherein, the pre-emphasis circuit 220 comprises a current sourcing circuit 220a and a current sinking circuit 220b which are coupled to the current input end N1 and the current output end N2 of the current control circuit 210, respectively. The current control circuit 210 further comprises the output ends R+ and R− coupled to a load RL.

In the current control circuit 210, four transistors, M21, M22, M23 and M24, are disposed. Wherein, the first source/drain end of the transistor M21 is coupled to the current input end N1, the gate end receives a driving signal VB, and the second source/drain end is connected to the output end R+ via the node 201. Similarly, the first source/drain end and the second source/drain end of the transistor M23 are coupled to the current input end N1 and the output end R− via the node 203, respectively, and the gate end receives the driving signal VA. In addition, the first source/drain end and the second source/drain end of the transistor M22 are coupled to the output end R+ via the node 201 and the current output end N2, respectively, and the gate end receives the driving signal VD. On the other hand, the first source/drain end and the second source/drain end of the transistor M24 are coupled to the second source/drain ends of the transistor M23 and M22, respectively, and the gate end receives the driving signal VC. In the embodiment, the current input end N1 of the current control circuit is coupled to a voltage supply VDD via a driving current source I1, and the current output end N2 is grounded via a driving current source I2.

Further, the transistor M21 and M23 can be PMOS transistors, and the transistor M22 and M24 can be NMOS transistors.

In the current sourcing circuit 220a of the pre-emphasis circuit, four transistors, M31, M32, M33 and M34, are disposed as well. Wherein, the first source/drain end of the transistor M31 is coupled to the voltage supply VDD via the resistor R1, the gate end receives the driving signal delay_VA, and the second source/drain end is coupled to the first source/drain end of the transistor M32. Similarly, the first source/drain end and the second source/drain end of the transistor M33 are coupled to the first source/drain ends of the transistor M31 and M34, respectively. The gate end of the transistor M33 receives the driving signal delay_VB. Wherein, the driving signal delay_VA and the driving signal delay_VB are the driving signal VA with a preset time delay and the driving signal VB with a preset time delay, respectively. In addition, the second source/drain ends of the transistors M32 and M34 are jointly coupled to the current input end N1 of the current control circuit 210, and the gate ends of the transistors M32 and M34 receive the driving signal VB and the driving signal VA, respectively.

Like the first-sub circuit 220a, the current sinking circuit 220b of the pre-emphasis circuit also comprises four transistors, M41, M42, M43 and M44. Wherein, the first source/drain end of the transistor M41 is coupled to the current output end N2 of the current control circuit 210, the gate end receives the driving signal VC, and the second source/drain end is coupled to the first source/drain end of the transistor M42. Similarly, the first source/drain end and the second source/drain end of the transistor M43 are coupled to the first source/drain ends of the transistor M41 and M44, respectively. The gate end of the transistor M43 receives the driving signal VD. In addition, the second source/drain ends of the transistor M42 and M44 are jointly grounded via the resistor R2, and the gate ends of the transistor M42 and M44 receive the driving signal delay_VD and the driving signal delay_VC, respectively. Wherein, the driving signal delay_VC and the driving signal delay_VD are the driving signal VC with a preset time delay and the driving signal VD with a preset time delay, respectively.

In the embodiment of the present invention, the transistors M31, M32, M33 and M34 can be PMOS transistors, and the transistors M41, M42, M43 and M44 can be NMOS transistors.

Further, in the embodiment of the present invention, the driving signal VA, VB, VC and VD can be generated by a signal generator 230. The signal generator 230 is formed by a plurality of phase-locked loops which generate the driving signal VA, VB, VC and VD respectively according to an input clock signal CLK.

To generate the driving signal delay_VA, delay_VB, delay_VC and delay_VD, the pre-emphasis circuit 220 is equipped with buffer modules 240 and 250.

In the buffer module 240, the inverter IV21, IV22, IV23 and IV24 are disposed. Wherein, the input end of the inverter IV21 receives the driving signal VB, and IV21 generates an output to the gate end of the transistor M33 through the inverter IV23. Thus, after a delay through the inverter IV21 and IV23, the driving signal VB generates a driving signal delay_VB. In other words, the above-mentioned preset time is the delay time of the inverter IV21 and IV23. In the same way, after the driving signal VA travels through the inverter IV22 and IV24, the driving signal with a preset time delay, i.e. delay_VA, is generated and sent to the gate end of the transistor M31.

Like the buffer 240, in the buffer module 250, the inverter IV25, IV26, IV27 and IV28 are disposed in the buffer module 250 as well. When the driving signal VC and VD travel through the inverter IV26, IV28 and IV25, IV27 respectively, the driving signal delay_VC and delay_VD are generated and sent to the gate ends of the transistor M44 and M42.

Figure 3:
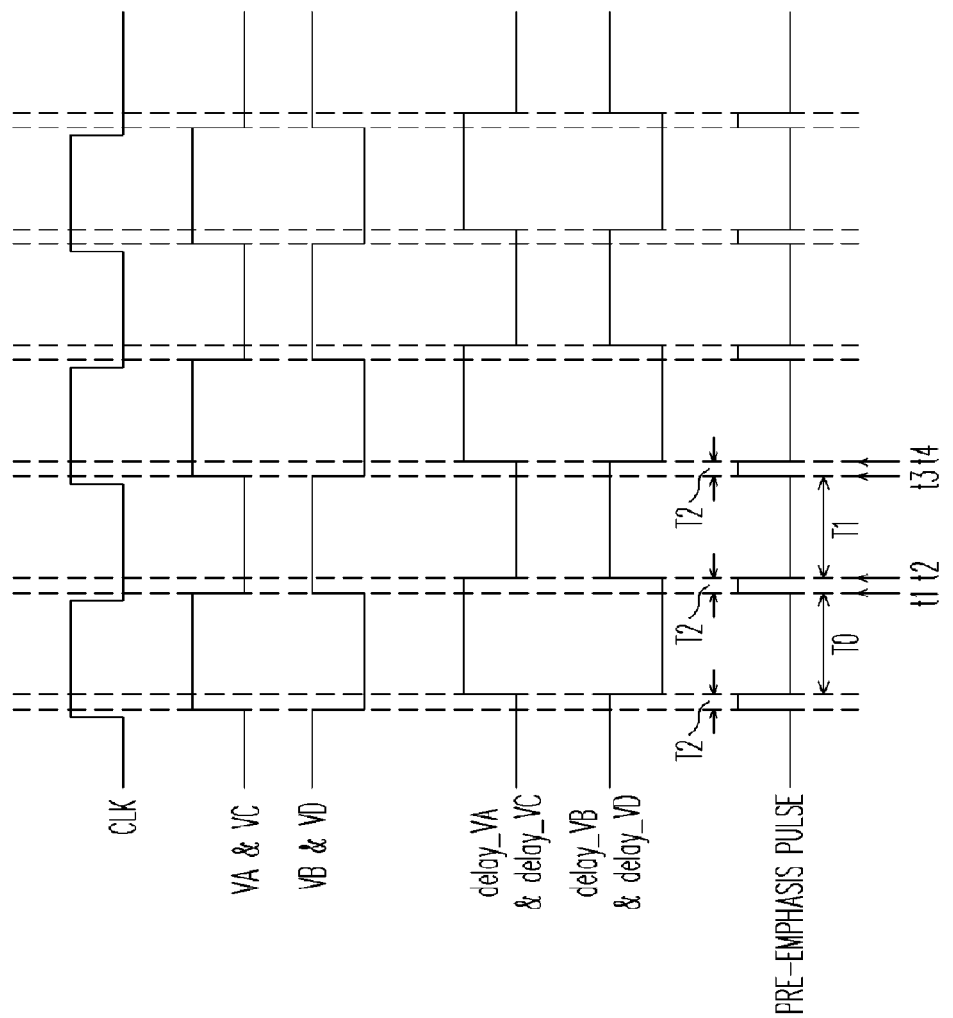
FIG. 3 illustrates the timing chart of the driving signals in FIG. 2.

FIG. 3 illustrates the timing chart of the driving signals in FIG. 2. Referring to FIG. 2 and FIG. 3, when the signal generator 230 receives the clock signal CLK, the driving signal VA, VB, VC and VD would be generated. Wherein, the driving signal VA and VB are synchronous but phase-inverted. In addition, the driving signal VA and VC can be the same signal, but the driving signal VB and VD can be another signal.

During the period of T0, the driving signal VA and VC take high voltage levels, but the driving signal VB and VD take low voltage levels. Thus, the transistor M21, M24, M32 and M41 are turned on and the transistor M23, M22, M34 and M43 are turned off. Because the time difference between the driving signal set of delay_VA, delay_VB, delay_VC and delay_VD and the driving signal set of VA, VB, VC and VD is a preset time T2, therefore the driving signal delay_VA and delay_VC would take the same phase as the driving signal VA and VC during the T0 period, and the driving signal delay_VB and delay_VD would take the same phase as the driving signal VB and VD. Accordingly, the transistor M33 and M44 are turned on and the transistor M31 and M42 are turned off. Here, only the driving current ID1 generated by the driving current source I1 flows to the current input end N1 of the current control circuit 210, then passes through the transistor M21 and arrives at the load RL via the node 201. Generally, the conventional resistance of load RL is about 100 ohm, but the present invention is not limited thereto. After the driving current ID1 passes through the load RL following the path A, it further passes the node 203, then through the transistor M24 and the driving current source I2, to arrive at the ground.

At the instant t1, if the driving signals VA and VC switch from a high level to a low level, while the driving signals VB and VD switch from a low level to a high level, then the transistor M23 and M22 are turned on, and transistor M21 and M24 are turned off. Consequently, the driving current ID1 would be steered to the first source/drain end of the transistor M23, through the node 203, to arrive at the load RL. Thereafter, the driving current ID1 follows the path B and passes the load RL, through the node 201, the transistor M22 and the driving current source I2, to arrive at the ground.

As the transistor M34 and M43 are turned on, the transistor M32 and M41 would be turned off. However, the driving signal delay_VA, delay_VB, delay_VC, and delay_VD still remain the states at the time t1 so that the transistor M33 and M44 still remain turned on, while the transistor M31 and M42 still remain turned off. At this instant, the pre-emphasis circuit 220 generates an extra driving current ID2 to flow to the current input end N1, follows the path of the driving current ID1 to arrive the ground. Such a process would continue for a preset time T2 such that the pre-emphasis circuit will enhance the switching speed of the LVDS driver during the period of time T2.

At the following time t2, the driving signals delay_VA and delay_VC switch from a high level to a low level, while the driving signals delay_VB and delay_VD switch from a low level to a high level. As a result, the transistors M33 and M44 are turned off, while the transistors M31 and M42 are turned on. Here, the driving current ID2 is disabled so that the LVDS driver 200 still keeps regular operation.

At the time t3 after the period of time T1, the driving signal VA and VC alter the states again from a low level to a high level, while the driving signal VB and VD alter the states from a high level to a low level. Meanwhile, the transistors M21 and M24 are turned on again, while the transistors M23 and M22 are turned off. Here the driving current ID1 is steered to take the path of the current control circuit 210, as the situation during the period of time T0.

In addition, the transistors M32 and M41 would be turned on again, while the transistors M34 and M43 are turned off. In the same way, as the above-described, because the driving signal delay_VA, delay_VB, delay_VC, and delay_VD would still remain the states at the time t3, so that the transistors M31 and M42 still keep turned on, while the transistors M33 and M44 still keep turned off for a while. At this instant, the pre-emphasis circuit 220 would again generate an extra driving current ID2 to flow into the current input end N1, following the path of the driving current ID1, to arrive at the ground. Such a process would also continue for a preset time T2.

At the following time t4, the driving signal delay_VA and delay_VC alter the states from a low level to a high level, while the driving signal delay_VB and delay_VD alter the states from a high level to a low level. As a result, the transistors M33 and M44 are turned on, while the transistors M31 and M42 are turned off. Here, the driving current ID2 is disabled, so that the LVDS driver 200 keeps regular operation.

The pre-emphasis pulse signal shown in FIG. 3 is generated by an exclusive-OR (XOR) operation between the driving signal VA, VC and the driving signal delay_VB, delay_VD, or generated by an exclusive-OR (XOR) operation between the driving signal VB, VD and the driving signal delay_VA, delay_VC. That's why the pre-emphasis circuit 220 only provides an extra driving current ID2 in the instant as the current control circuit switches the path of the driving current ID1. Therefore, the present invention doesn't affect the regular operation of the LVDS driver 200. In addition, such a pre-emphasis pulse signal is also capable of providing higher resolution.

Figure 4:
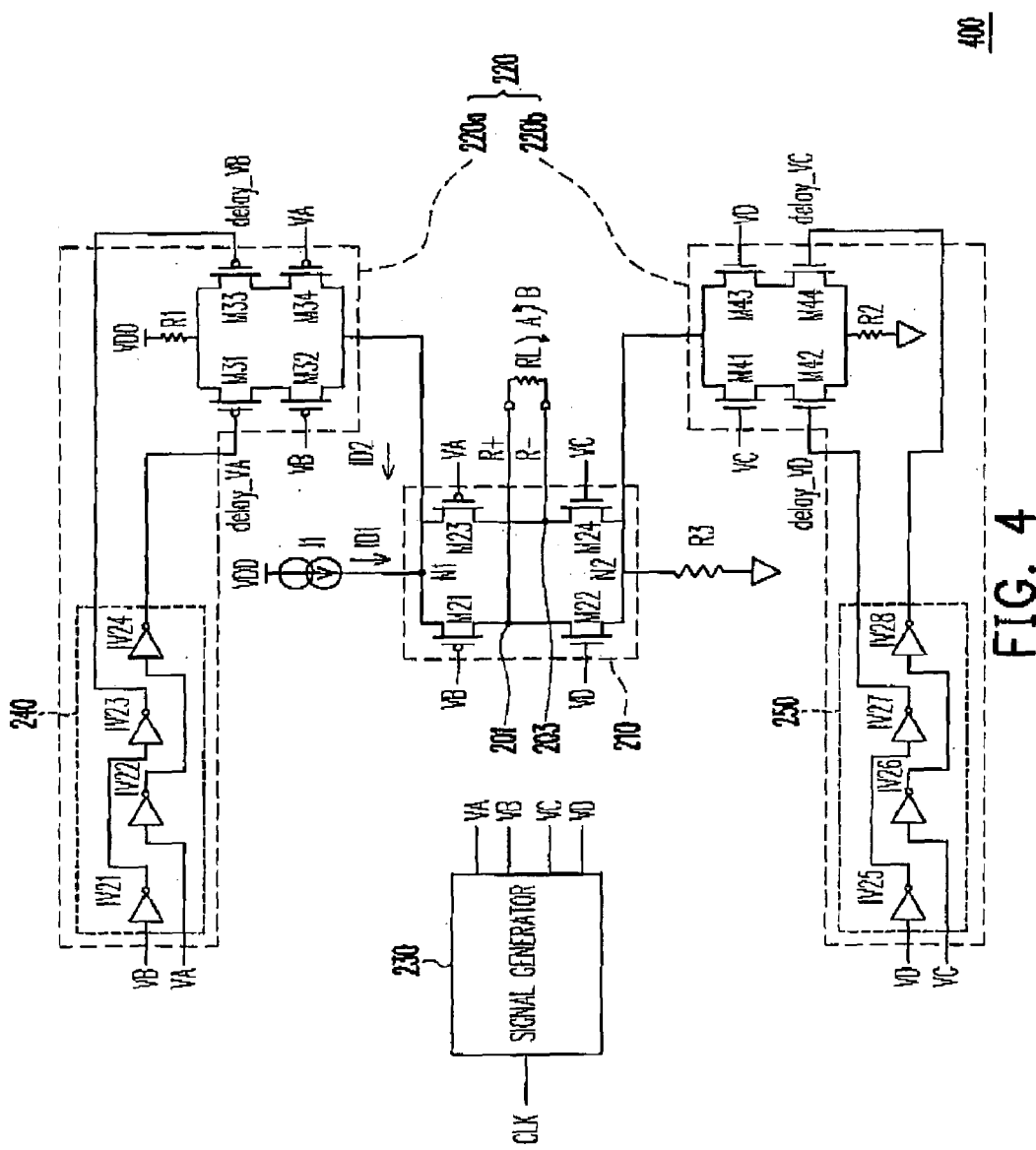
FIG. 4 is a schematic circuit drawing of a low-voltage differential signal driver with a pre-emphasis circuit in accordance with another embodiment of the present invention.

FIG. 4 is a schematic circuit drawing of a low-voltage differential signal driver with a pre-emphasis circuit in accordance with another embodiment of the present invention. Referring to FIG. 4, the configuration of the LVDS driver 400 in the embodiment is similar to the LVDS driver 200 in FIG. 2. The difference between the LVDS driver 400 and the LVDS driver 200 is that the current output end N2 of the current control circuit in the driver 400 is connected to the ground through the resistor R3. As to the operation of the LVDS driver 400, it is the same as the LVDS driver 200, and can be referred to the above-described operation for the LVDS driver 200.

Although the transistor M21, M23, M31, M32, M33 and M34 are PMOS transistors, while the transistor M22, M24, M41, M42, M43 and M44 are NMOS transistors, but the present invention is not limited thereto. One of ordinary skill in the art would know that the present invention only requires the electric characteristic of the transistor M21, M23, M31, M32, M33 and M34 to be the same but opposite to that of the transistor M22, M24, M41, M42, M43 and M44.

To sum up, the present invention has the at least the following advantages:

Since the driving signals used in the present invention are synchronous, higher resolution can be provided.

Each driving signal in the present invention only requires at most two inverters for processing, and thus a higher switching speed is possible.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A pre-emphasis circuit suitable for a low-voltage differential signal (LVDS) driver with a current input end and a current output end, the pre-emphasis circuit comprising:
    a first PMOS transistor, wherein the first source/drain end thereof is coupled to a voltage supply through a first resistor and the gate end thereof receives a first driving signal with a preset time delay;
    a second PMOS transistor, wherein the first source/drain end thereof is coupled to the second source/drain end of said first PMOS transistor, the gate end thereof receives a second driving signal, and the second source/drain end is coupled to said current input end;
    a third PMOS transistor, wherein the first source/drain end thereof is coupled to the first source/drain end of said first PMOS transistor and the gate end thereof receives said second driving signal with said preset time delay;
    a fourth PMOS transistor, wherein the first source/drain end thereof is coupled to the second source/drain end of said third PMOS transistor, the gate end thereof receives said first driving signal, and the second source/drain end thereof is coupled to the second source/drain end of said second PMOS transistor;
    a first NMOS transistor, wherein the first source/drain end thereof is coupled to said current output end and the gate end receives a third driving signal;
    a second NMOS transistor, wherein the first source/drain end thereof is coupled to the second source/drain end of said first NMOS transistor, the gate end thereof receives a fourth driving signal with said preset time delay, and the second source/drain end thereof is grounded through a second resistor;
    a third NMOS transistor, wherein the first source/drain end thereof is coupled to the first source/drain end of said first NMOS transistor and the gate end thereof receives said fourth driving signal; and
    a fourth NMOS transistor, wherein the first source/drain end thereof is coupled to the second source/drain end of said third NMOS transistor, the gate end thereof is coupled to said third driving signal with said preset time delay, and the second source/drain end thereof is coupled to the second source/drain end of said second NMOS transistor.

2. The pre-emphasis circuit as recited in claim 1, further comprising a first buffer module, which comprising:
    a first inverter, an input end thereof receiving said second driving signal;
    a second inverter, an input end thereof receiving said first driving signal;
    a third inverter, an input end thereof receiving the output from said first inverter, and an output end thereof being coupled to the gate end of said third PMOS transistor; and
    a fourth inverter, an input end thereof receiving the output of said second inverter, and an output end thereof being coupled to the gate end of said first PMOS transistor.

3. The pre-emphasis circuit as recited in claim 1, further comprising a second buffer module, which comprising:
    a fifth inverter, an input end thereof receiving said fourth driving signal;
    a sixth inverter, an input end thereof receiving said third driving signal;
    a seventh inverter, an input end thereof receiving the output from said fifth inverter and the output end thereof being coupled to the gate end of said second NMOS transistor; and
    an eighth inverter, an input end thereof receiving the output of said sixth inverter and the output end thereof being coupled to the gate end of said fourth NMOS transistor.

4. A pre-emphasis circuit suitable for a low-voltage differential signal (LVDS) driver with a current input end and a current output end, the pre emphasis circuit comprising:
    a first transistor, wherein the first source/drain end thereof is coupled to a voltage supply through a first resistor and the gate end thereof receives a first driving signal with a preset time delay;
    a second transistor, wherein the first source/drain end thereof is coupled to the second source/drain end of said first transistor, the gate end thereof receives a second driving signal, and the second source/drain end thereof is coupled to said current input end;
    a third transistor, wherein the first source/drain end thereof is coupled to the first source/drain end of said first transistor and the gate end thereof receives said second driving signal with said preset time delay;
    a fourth transistor, wherein the first source/drain end thereof is coupled to the second source/drain end of said third transistor, the gate end thereof receives said first driving signal, and the second source/drain end thereof is coupled to the second source/drain end of said second transistor;
    a fifth transistor, wherein the first source/drain end thereof is coupled to said current output end, and the gate end thereof receives a third driving signal;

a sixth transistor, wherein the first source/drain end thereof is coupled to the second source/drain end of said fifth transistor, the gate end thereof receives a fourth driving signal with said preset time delay, and the second source/drain end thereof is grounded through a second resistor;

a seventh transistor, wherein the first source/drain end thereof is coupled to the first source/drain end of said fifth transistor and the gate end thereof receives said fourth driving signal; and an eighth transistor, wherein the first source/drain end thereof is coupled to the second source/drain end of said seventh transistor, the gate end thereof is coupled to said third driving signal with said preset time delay, and the second source/drain end thereof is coupled to the second source/drain end of said sixth transistor.

5. The pre-emphasis circuit as recited in claim 4, wherein the electric characteristic of said first transistor, said second transistor, said third transistor and said fourth transistor are all the same, but are opposite to that of said fifth transistor, said sixth transistor, said seventh transistor and said eighth transistor.

6. A low-voltage differential signal (LVDS) driver with a pre-emphasis circuit, comprising:

a current control circuit having a current input end, a current output end, a first output end and a second output end, wherein said current input end is coupled to a voltage supply through a first driving current source, said current output end is grounded through a second driving current source, and said first output end and said second output end are coupled to a load;

a first PMOS transistor, wherein the first source/drain end thereof is coupled to said voltage supply through a first resistor, and the gate end thereof receives a first driving signal with a preset time delay;

a second PMOS transistor, wherein the first source/drain end thereof is coupled to the second source/drain end of said first PMOS transistor, the gate end thereof receives a second driving signal, and the second source/drain end thereof is coupled to said current input end;

a third PMOS transistor, wherein the first source/drain end thereof is coupled to the first source/drain end of said first PMOS transistor, and the gate end thereof receives said second driving signal with said preset time delay;

a fourth PMOS transistor, wherein the first source/drain end thereof is coupled to the second source/drain end of said third PMOS transistor, the gate end thereof receives said first driving signal, and the second source/drain end thereof is coupled to the second source/drain end of said second PMOS transistor;

a first NMOS transistor, wherein the first source/drain end thereof is coupled to said current output end, and the gate end thereof receives a third driving signal;

a second NMOS transistor, wherein the first source/drain end thereof is coupled to the second source/drain end of said first NMOS transistor, the gate end thereof receives a fourth driving signal with said preset time delay, and the second source/drain end is grounded through a second resistor;

a third NMOS transistor, wherein the first source/drain end thereof is coupled to the first source/drain end of said first NMOS transistor, and the gate end thereof receives said fourth driving signal; and a fourth NMOS transistor, wherein the first source/drain end thereof is coupled to the second source/drain end of said third NMOS transistor, the gate end thereof receives said third driving signal with said preset time delay, and the second source/drain end thereof is coupled to the second source/drain end of said second NMOS transistor.

7. The low-voltage differential signal driver with the pre-emphasis circuit as recited in claim 6, wherein said current control circuit comprises:

a fifth PMOS transistor, wherein the first source/drain end thereof is coupled to said current input end and the gate end thereof receives said second driving signal;

a fifth NMOS transistor, wherein the first source/drain end thereof is coupled to the first source/drain end of said fifth PMOS transistor, the gate end thereof receives said fourth driving signal, and the second source/drain end thereof is coupled to said current output end;

a sixth PMOS transistor, wherein the first source/drain end thereof is coupled to said current input end and the gate end thereof receives said first driving signal;

a sixth NMOS transistor, wherein the first source/drain end thereof is coupled to the second source/drain end of said sixth PMOS transistor, the gate end thereof receives said third driving signal, and the second source/drain end thereof is coupled to said current output end.

8. The low-voltage differential signal driver with the pre-emphasis circuit as recited in claim 6, further comprising a signal generator for generating said first driving signal, said second driving signal, said third driving signal and said fourth driving signal.

9. The low-voltage differential signal driver with the pre-emphasis circuit as recited in claim 6, further comprising a first buffer module, which comprising:

a first inverter, wherein the input end thereof receives said second driving signal;

a second inverter, wherein the input end thereof receives said first driving signal;

a third inverter, wherein the input end thereof receives the output of said first inverter, and the output end thereof is coupled to the gate end of said third PMOS transistor; and a fourth inverter, wherein the input end thereof receives the output of said second inverter, and the output end thereof is coupled to the gate end of said first PMOS transistor.

10. The low-voltage differential signal driver with the pre-emphasis circuit as recited in claim 6, further comprising a second buffer module, which comprising:

a fifth inverter, wherein the input end thereof receives said fourth driving signal;

a sixth inverter, wherein the input end thereof receives said third driving signal;

a seventh inverter, wherein the input end thereof receives the output of said fifth inverter, and the output end thereof is coupled to the gate end of said second NMOS transistor; and an eighth inverter, wherein the input end thereof receives the output of said sixth inverter, and the output end thereof is coupled to the gate end of said fourth NMOS transistor.

11. A low-voltage differential signal (LVDS) driver with a pre-emphasis circuit, comprising:

a current control circuit having a current input end, a current output end, a first output end and a second output end, wherein said current input end is coupled to a voltage supply through a driving current source, said current output end is grounded through a first resistor, and said first output end and said second output end are coupled to a load;

a first PMOS transistor, wherein the first source/drain end thereof is coupled to said voltage supply through a second resistor and the gate end thereof receives a first driving signal with a preset time delay;

a second PMOS transistor, wherein the first source/drain end thereof is coupled to the second source/drain end of said first PMOS transistor, the gate end thereof receives a second driving signal, and the second source/drain end thereof is coupled to said current input end;

a third PMOS transistor, wherein the first source/drain end thereof is coupled to the first source/drain end of said first PMOS transistor and the gate end thereof receives said second driving signal with said preset time delay;

a fourth PMOS transistor, wherein the first source/drain end thereof is coupled to the second source/drain end of said third PMOS transistor, the gate end thereof receives said first driving signal, and the second source/drain end thereof is coupled to the second source/drain end of said second PMOS transistor;

a first NMOS transistor, wherein the first source/drain end thereof is coupled to said current output end and the gate end thereof receives a third driving signal;

a second NMOS transistor, wherein the first source/drain end thereof is coupled to the second source/drain end of said first NMOS transistor, the gate end thereof receives a fourth driving signal with said preset time delay, and the second source/drain end thereof is grounded through a third resistor;

a third NMOS transistor, wherein the first source/drain end thereof is coupled to the first source/drain end of said first NMOS transistor and the gate end thereof receives said fourth driving signal; and a fourth NMOS transistor, wherein the first source/drain end thereof is coupled to the second source/drain end of said third NMOS transistor, the gate end thereof is coupled to said third driving signal with said preset time delay, and the second source/drain end thereof is coupled to the second source/drain end of said second NMOS transistor.

12. The low-voltage differential signal driver with the pre-emphasis circuit as recited in claim 11, wherein said current control circuit comprises:

a fifth PMOS transistor, wherein the first source/drain end thereof is coupled to said current input end and the gate end thereof receives said second driving signal;

a fifth NMOS transistor, wherein the first source/drain end thereof is coupled to the second source/drain end of said fifth PMOS transistor, the gate end thereof receives said fourth driving signal, and the second source/drain end thereof is coupled to said current output end;

a sixth PMOS transistor, wherein the first source/drain end thereof is coupled to said current input end and the gate end thereof receives said first driving signal;

a sixth NMOS transistor, wherein the first source/drain end thereof is coupled to the second source/drain end of said sixth PMOS transistor, the gate end thereof receives said third driving signal, and the second source/drain end thereof is coupled to said current output end.

13. The low-voltage differential signal driver with the pre-emphasis circuit as recited in claim 11, further comprising a signal generator for generating said first driving signal, said second driving signal, said third driving signal and said fourth driving signal.

14. The low-voltage differential signal driver with the pre-emphasis circuit as recited in claim 11, further comprising a first buffer module, which comprising:

a first inverter, wherein the input end thereof receives said second driving signal;

a second inverter, wherein the input end thereof receives said first driving signal;

a third inverter, wherein the input end thereof receives the output of said first inverter, and the output end thereof is coupled to the gate end of said third PMOS transistor; and a fourth inverter, wherein the input end thereof receives the output of said second inverter, and the output end thereof is coupled to the gate end of said first PMOS transistor.

15. The low-voltage differential signal driver with the pre-emphasis circuit as recited in claim 11, further comprising a second buffer module, which comprising:

a fifth inverter, wherein the input end thereof receives said fourth driving signal;

a sixth inverter, wherein the input end thereof receives said third driving signal;

a seventh inverter, wherein the input end thereof receives the output of said fifth inverter, and the output end thereof is coupled to the gate end of said second NMOS transistor; and an eighth inverter, wherein the input end thereof receives the output of said sixth inverter, and the output end thereof is coupled to the gate end of said fourth NMOS transistor.

16. A low-voltage differential signal (LVDS) driver with a pre-emphasis circuit, comprising:

a current control circuit, comprising a current input end, a current output end, a first output end and a second output end, wherein said first output end and said second output end are coupled to a load;

a first transistor, wherein the first source/drain end thereof is coupled to a voltage supply through a first resistor and the gate end thereof receives a first driving signal with a preset time delay;

a second transistor, wherein the first source/drain end thereof is coupled to the second source/drain end of said first transistor, the gate end thereof receives a second driving signal, and the second source/drain end thereof is coupled to said current input end;

a third transistor, wherein the first source/drain end thereof is coupled to the first source/drain end of said first transistor and the gate end thereof receives said second driving signal with said preset time delay;

a fourth transistor, wherein the first source/drain end thereof is coupled to the second source/drain end of said third transistor, the gate end thereof receives said first driving signal, and the second source/drain end thereof is coupled to the second source/drain end of said second transistor;

a fifth transistor, wherein the first source/drain end thereof is coupled to said current output end and the gate end thereof receives a third driving signal;

a sixth transistor, wherein the first source/drain end thereof is coupled to the second source/drain end of said fifth transistor, the gate end thereof receives a fourth driving signal with said preset time delay, and the second source/drain end thereof is grounded through a second resistor;

a seventh transistor, wherein the first source/drain end thereof is coupled to the first source/drain end of said fifth transistor and the gate end thereof receives said fourth driving signal; and an eighth transistor, wherein the first source/drain end thereof is coupled to the second source/drain end of said seventh transistor, the gate end thereof is coupled to said third driving signal with said preset time delay, and the second source/drain end thereof is coupled to the second source/drain end of said sixth transistor.

17. The low-voltage differential signal driver with the pre-emphasis circuit as recited in claim 16, wherein said current control circuit comprises:
- a ninth transistor, wherein the first source/drain end thereof is coupled to said current input end and coupled to said voltage supply through a first driving current source, and the gate end thereof receives said second driving signal;
- a tenth transistor, wherein the first source/drain end thereof is coupled to the second source/drain end of said ninth transistor, the gate end thereof receives said fourth driving signal, and the second source/drain end thereof is coupled to said current output end and grounded through either a second driving current source or a third resistor;
- an eleventh transistor, wherein the first source/drain end thereof is coupled to the first source/drain end of said ninth transistor, and the gate end thereof receives said first driving signal;
- a twelfth transistor, wherein the first source/drain end thereof is coupled to the second source/drain end of said eleventh transistor, the gate end thereof receives said third driving signal, and the second source/drain end thereof is coupled to the second source/drain end of said tenth transistor.

18. The low-voltage differential signal driver with the pre-emphasis circuit as recited in claim 17, wherein the electric characteristic of said first transistor, said second transistor, said third transistor, said fourth transistor, said ninth transistor, and said eleventh transistor are all the same, but are opposite to that of said fifth transistor, said sixth transistor, said seventh transistor, said eighth transistor, said tenth transistor and said twelfth transistor.

19. The low-voltage differential signal driver with the pre-emphasis circuit as recited in claim 16, wherein said current input end is coupled to said voltage supply through a first driving current source, and said current output end is grounded through a second driving current source.

20. The low-voltage differential signal driver with the pre-emphasis circuit as recited in claim 16, wherein said current input end is coupled to said voltage supply through a driving current source, and said current output end is grounded through a resistor.

* * * * *